(12) United States Patent
Gomi

(10) Patent No.: US 7,553,457 B2
(45) Date of Patent: Jun. 30, 2009

(54) CHEMICAL PROCESSING APPARATUS FOR MANUFACTURING CIRCUIT SUBSTRATES

(75) Inventor: Tsugio Gomi, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 657 days.

(21) Appl. No.: 10/855,982

(22) Filed: May 27, 2004

(65) Prior Publication Data

US 2005/0008360 A1 Jan. 13, 2005

(30) Foreign Application Priority Data

May 30, 2003 (JP) ............................. 2003-155890

(51) Int. Cl.
*H01L 21/306* (2006.01)
(52) U.S. Cl. ...................................... 422/129; 430/264
(58) Field of Classification Search ................. 422/129; 354/319; 430/264; 396/578; 220/200, 255
See application file for complete search history.

(56) References Cited

U.S. PATENT DOCUMENTS

| 4,244,487 | A | * | 1/1981 | Kern ........................... 220/216 |
| 4,324,479 | A | * | 4/1982 | Sachs ......................... 396/622 |
| 4,931,378 | A | * | 6/1990 | Hirano et al. ................ 430/264 |
| 5,198,848 | A | * | 3/1993 | Tahon et al. ................. 396/617 |
| 5,701,542 | A | * | 12/1997 | Sasayama .................... 396/578 |
| 6,995,834 | B2 | * | 2/2006 | Shabani et al. ................ 356/36 |

FOREIGN PATENT DOCUMENTS

| CN | 1052149 | | 6/1991 |
| JP | 60-154532 | * | 8/1985 |
| JP | 06-104234 | | 4/1994 |
| JP | 10-265988 | * | 6/1998 |
| JP | 2004-029246 | * | 1/2004 |

* cited by examiner

*Primary Examiner*—N. Bhat
(74) *Attorney, Agent, or Firm*—Hogan & Hartson LLP

(57) ABSTRACT

A chemical processing apparatus includes a chemical tank that stores a chemical, means for transferring an object to be processed into the chemical and a lid disposed to cover a liquid surface of the chemical and to float on the chemical.

7 Claims, 3 Drawing Sheets

CHEMICAL PROCESSING APPARATUS FOR MANUFACTURING CIRCUIT SUBSTRATES

BACKGROUND OF THE INVENTION

1. Field of the Invention

The present invention relates to chemical processing apparatuses, chemical processing methods and methods for manufacturing circuit substrates, and more particularly, are preferably applied to steps of wet processing of flexible circuit substrates.

2. Description of Related Art

A conventional chemical processing apparatus, uses a cleaning processing tank having a lid that is provided in a manner to make contact with a liquid surface of a cleaning liquid in order to maintain the concentration of the cleaning liquid constant, and stabilizes the etch rate and cleaning efficiency.

However, in the conventional chemical processing apparatus, the lid that is provided in a manner to make contact with the liquid surface of the cleaning liquid is fixed. For this reason, when the chemical reduces during a chemical processing, the lid and the chemical are separated from each other, and the liquid surface of the chemical is exposed. As a result, in the conventional chemical processing apparatus, the chemical make contact with the air during the chemical processing, and the chemical deteriorates due to oxidation of the chemical, which results in a problem in that the quality control becomes difficult.

Accordingly, it is an advantage of the present invention to provide a chemical processing apparatus, a chemical processing method and a method for manufacturing a circuit substrate, which can advance chemical processing while preventing a liquid surface of a chemical from being exposed to the air.

SUMMARY OF THE INVENTION

To solve the aforementioned problems, a chemical processing apparatus in accordance with an embodiment of the present invention includes a chemical tank that stores chemical, a transfer device that transfers an object to be processed into the chemical and a lid that is disposed to cover a liquid surface of the chemical and to float on the chemical.

Accordingly, by simply placing the lid to float on the chemical, the lid can follow the liquid surface of the chemical even when the liquid surface of the chemical lowers. For this reason, even when the chemical decreases along with progresses of the chemical processing, the liquid surface of the chemical is prevented from being exposed to the air, and deterioration of the chemical due to oxidation of the chemical or the like can be prevented, such that the service life of the chemical can be extended, the chemical processing can be conducted while maintaining the quality of the chemical, and the chemical processing can be stably conducted.

Also, in the chemical processing apparatus in accordance with an embodiment of the present invention the lid is equipped with a concave section or an opening section for taking the object to be processed in and out of the chemical.

Accordingly, the object to be processed can be dipped in the chemical while maintaining the state in which the lid floats on the chemical, and the chemical processing can be efficiently conducted while maintaining the quality of the chemical.

Also, the chemical processing apparatus in accordance with an embodiment of the present invention includes the chemical tank being equipped with a guide rail for guiding up-down movements of the lid, wherein the lid is equipped with a cut section for inserting the guide rail.

Accordingly, movements of the lid in a horizontal direction can be prevented while maintaining the state in which the lid floats on the chemical. For this reason, even when the lid is placed to float on the chemical, the lid can move up and down while the lid can be prevented from being carried away by the chemical.

Also, the chemical processing apparatus in accordance with an embodiment of the present invention has the lid formed from resin.

Accordingly, even when the chemical is composed of acid or alkali, the lid can be made to float on the chemical while preventing the lid from being eroded by the chemical, such that the chemical processing can be stably conducted.

Also, a chemical processing apparatus in accordance with an embodiment of the present invention includes a chemical tank that stores a chemical, rollers provided in the chemical tank for guiding a tape substrate, a lid that is disposed to cover a liquid surface of the chemical and to float on the chemical and a pair of concave sections or opening sections that are provided in the lid along a transfer direction of the tape substrate for taking the tape substrate in and out of the chemical tank.

Accordingly, by simply placing the lid to float on the chemical, the lid can follow the liquid surface of the chemical even when the liquid surface of the chemical lowers, and the tape substrate can be continuously brought in and out of the chemical tank. For this reason, even when the chemical decreases along with progresses of the chemical processing, the liquid surface of the chemical is prevented from being exposed to the air, the chemical processing on the tape substrate can be continuously conducted and deterioration of the chemical due to oxidation of the chemical or the like can be suppressed and the service life of the chemical can be extended. Also, the chemical processing can be efficiently conducted while maintaining the quality of the tape substrate at a constant level or higher.

A chemical processing method in accordance with an embodiment of the present invention includes a step of disposing and floating a lid on a chemical that is stored in a chemical tank and a step of dipping an object to be processed in the chemical disposed with the lid floating thereon, to thereby process the object with the chemical.

Accordingly, by simply placing the lid to float on the chemical, the lid can follow the liquid surface of the chemical even when the liquid surface of the chemical lowers. For this reason, even when the chemical decreases along with progress of the chemical processing, the liquid surface of the chemical is prevented from being exposed to the air, deterioration of the chemical due to oxidation of the chemical or the like can be prevented and the service life of the chemical can be extended. The chemical processing can be conducted while maintaining the quality of the chemical and the chemical processing can be stably conducted.

Also, a method for manufacturing a circuit substrate in accordance with an embodiment of the present invention includes a step of forming a conductive layer on a tape substrate, a step of coating a resist on the conductive layer, a step of selectively exposing the resist coated on the conductive layer to light, a step of patterning the resist by dipping the tape substrate with the resist that has been processed with exposure in a tank of developing solution disposed with a lid floating thereon and a step of etching the conductive layer by using the resist patterned to thereby form a wiring layer on the tape substrate.

Accordingly, a development processing on the resist formed on the tape substrate can be conducted while enabling the lid to follow the liquid surface of the developing solution. For this reason, by simply placing the lid to float on the developing solution, the liquid surface of developing solution can be prevented from being exposed to the air even when the developing solution decreases along with the progresses of the development processing, the manufacturing process can be prevented from becoming complex, and the development processing can be stably conducted.

Also, a method for manufacturing a circuit substrate in accordance with an embodiment of the present invention includes a step of forming a conductive layer on a tape substrate, a step of forming a resist pattern on the conductive layer and a step of patterning the conductive layer by dipping the tape substrate with the resist pattern formed thereon in a tank of etching solution disposed with a lid floating thereon.

Accordingly, an etch processing on the conductive layer formed on the tape substrate can be conducted while enabling the lid to follow the liquid surface of etching solution. For this reason, by simply placing the lid to float on the etching solution, the liquid surface of the etching solution can be prevented from being exposed to the air even when the etching solution decreases along with the progress of the etch processing, the manufacturing process can be prevented from becoming complex, and the etch processing can be stably conducted.

EMBODIMENTS OF THE PRESENT INVENTION

A chemical processing device and a chemical processing method in accordance with embodiments of the present invention will be described below with reference to the accompanying drawings.

Figure 1:
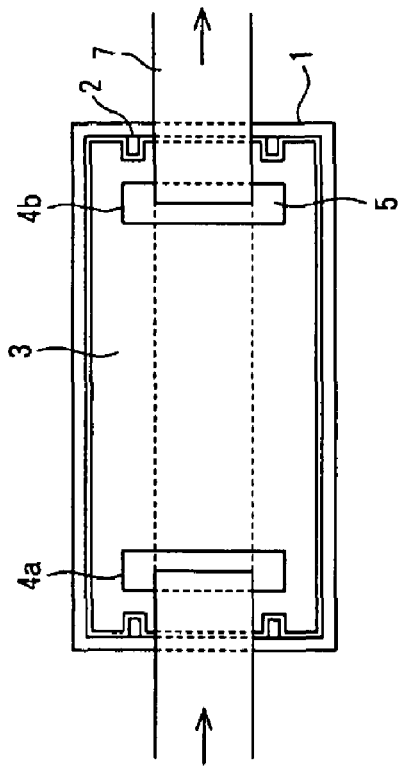
FIGS. 1(a)-1(d) are views indicating an outline of the structure of a chemical processing device in accordance with a first embodiment of the present invention.
Figure 1:
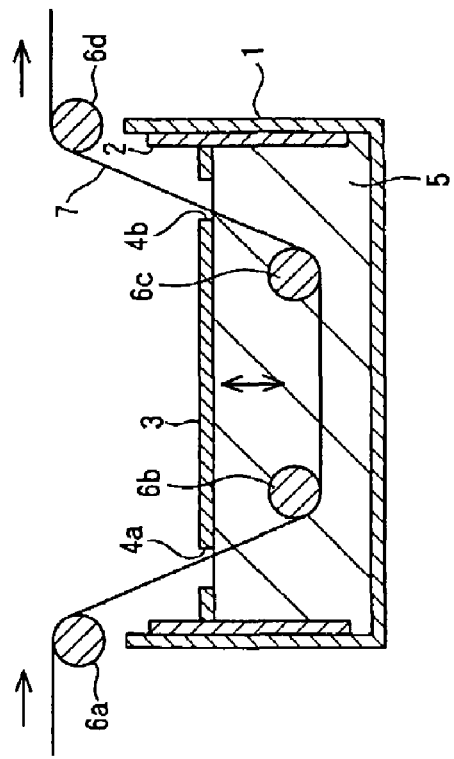
Figure 1:
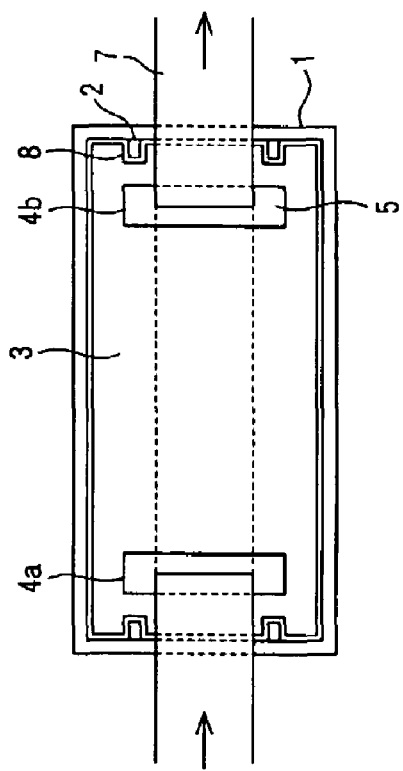
Figure 1:
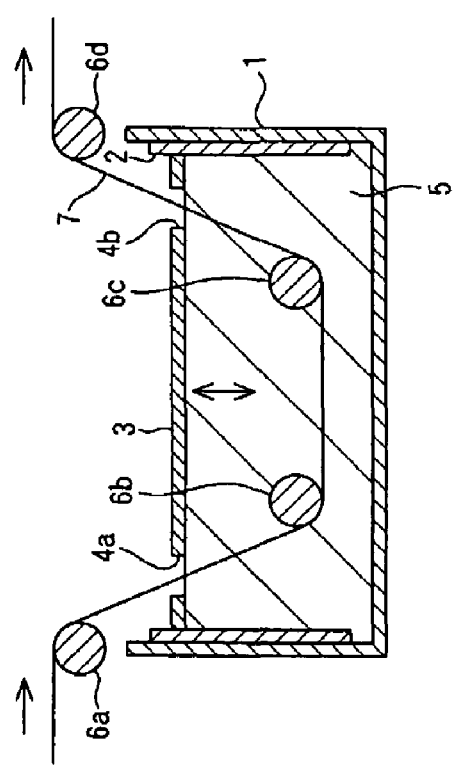

FIG. 1(a) is a plan view indicating an outline of the structure of a chemical processing device in accordance with a first embodiment of the present invention. FIG. 1(b) is a cross-sectional view indicating an outline of the structure of the chemical processing device in accordance with the first embodiment of the present invention. FIG. 1(c) is a plan view of an outline of the structure of the chemical processing device in an ongoing chemical processing and FIG. 1(d) is a cross-sectional view of an outline of the structure of the chemical processing device in an ongoing chemical processing.

Referring to FIG. 1(a) and FIG. 1(b), a chemical tank 1 stores a chemical 5, and a lid 3 is placed to float on the chemical 5. The chemical tank 1 is provided with guide rails 2 extending in a depth direction, and the lid 3 is provided with cut sections 8 capable of inserting the guide rails 2. Also, the lid 3 is provided with opening sections 4a and 4b, along a transfer direction of a tape substrate 7, for bringing the tape substrate 7 in and out. Further, rollers 6a-6d for guiding the tape substrate 7 are provided along the transfer direction of the tape substrate 7, wherein the rollers 6a and 6d are disposed outside the chemical tank 1, and the rollers 6b and 6c are disposed inside the chemical tank 1.

It is noted here that the lid 3 is formed to have a specific gravity smaller than the specific gravity of the chemical 5. As a material of the lid 3, for example, resin such as Teflon (registered trademark), acrylic fiber, polypropylene and the like may preferably be used. By so doing, even when the chemical 5 is composed of acid or alkali, the lid 3 can float on the chemical 5, and the lid 3 can be prevented from being eroded by the chemical 5, such that the chemical processing on the tape substrate 7 can be stably conducted.

Also, as the chemical 5, for example, a developing solution for a resist, a remover solution for a resist, an etching solution for a metal such as Cu can be listed. Furthermore, the tape substrate 7 can be used in, for example, a chip of film (COF), a tape carrier package (TCP) and a tape carrier module (TCM).

Then, when the tape substrate 7 is processed with the chemical, the tape substrate 7 is passed through the opening sections 4a and 4b, thereby dipping the tape substrate 7 in the chemical 5 through the lid 3. In a state in which the tape substrate 7 is dipped in the chemical 5, the tape substrate 7 is transferred through the rollers 6a-6d, and the tape substrate 7 is processed with the chemical.

As the chemical processing on the tape substrate 7 advances, the chemical 5 that adheres to the tape substrate 7 is brought out of the chemical tank 1, as indicated in FIG. 1(c) and FIG. 1(d), and the chemical 5 in the chemical tank 1 decreases. It is noted here that, by placing and floating the lid 3 on the chemical 5, the lid 3 can follow the liquid surface of the chemical 5, even when the chemical 5 in the chemical tank 1 decreases and the liquid surface of the chemical 5 lowers. For this reason, when the chemical processing on the tape substrate 7 is continuously conducted, the state in which the lid 3 is always in contact with the liquid surface of the chemical 5 can be maintained, and the liquid surface of the chemical 5 is prevented from being exposed to the air.

As a result, by only placing and floating the lid 3 on the chemical 5, the liquid surface of the chemical 5 is not exposed to the air, the chemical processing on the tape substrate 7 can be advanced, deterioration of the chemical 5 due to oxidation of the chemical 5 can be suppressed and thus the service life of the chemical 5 can be extended without using a complex mechanism for moving the lid 3, and the chemical processing can be effectively conducted while maintaining the quality of the tape substrate 7 at a constant level or higher.

Also, as the guide rails 2 for guiding the lid 3 are provided, movements of the lid 3 in a horizontal direction can be prevented while maintaining the state in which the lid 3 floats on the chemical 5. For this reason, even when the lid 3 is placed to float on the chemical 5, the lid 3 can be prevented from being carried away by the chemical 5, and the lid 3 is prevented from colliding against the substrate 7, such that the tape substrate 7 can be protected.

Furthermore, since the lid 3 is provided with the opening sections 4a and 4b for bringing the tape substrate 7 in and out, the tape substrate 7 can be dipped in the chemical 5 in a state in which the lid 3 floats on the chemical 5, and the chemical processing on the tape substrate 7 can be effectively conducted while maintaining the quality of the chemical 5.

Figure 2:
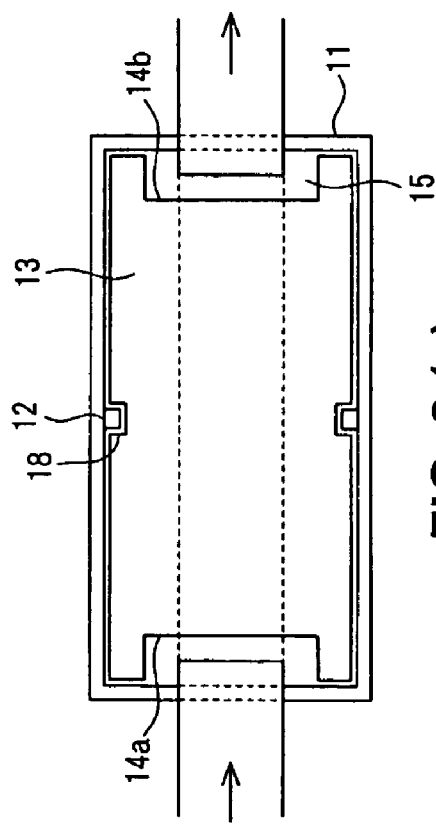
FIGS. 2(a)-2(d) are views indicating an outline of the structure of a chemical processing device in accordance with a second embodiment of the present invention.
Figure 2:
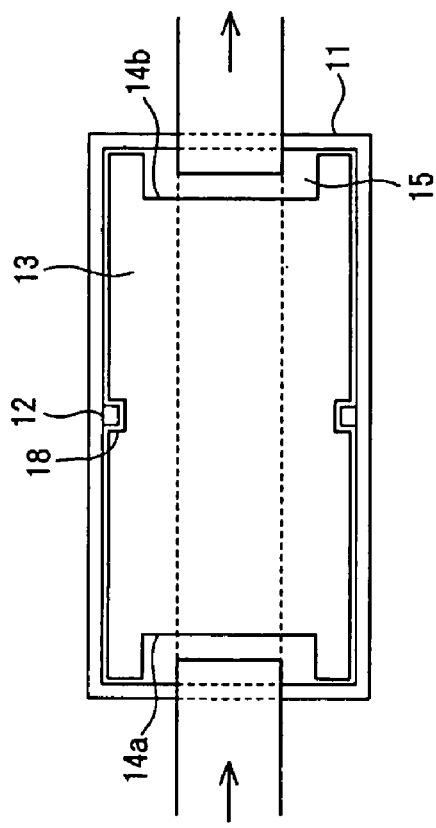
Figure 2:
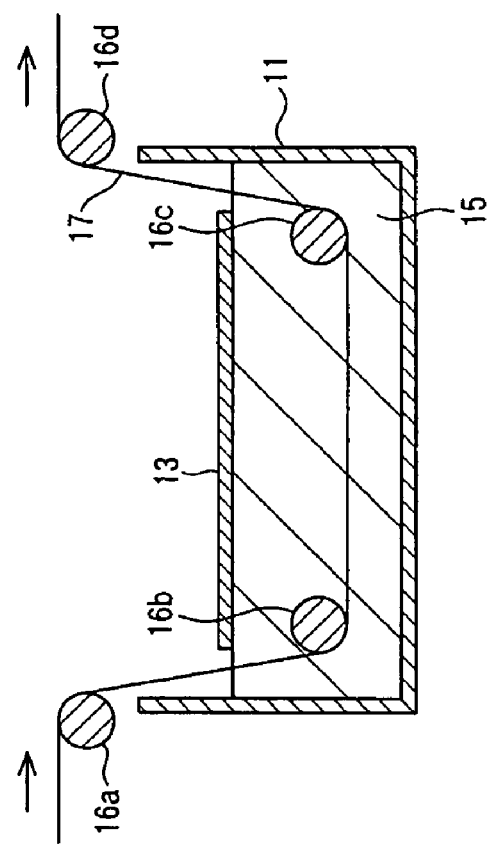
Figure 2:
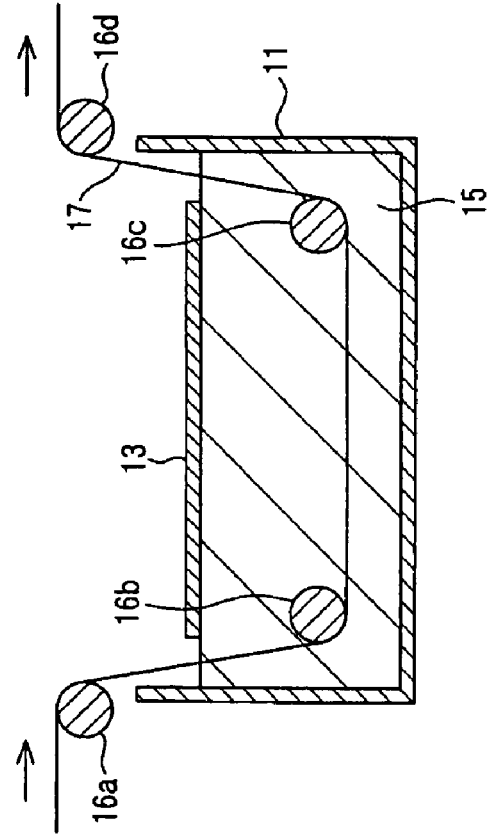

FIG. 2(a) is a plan view indicating an outline of the structure of a chemical processing device in accordance with a second embodiment of the present invention. FIG. 2(b) is a cross-sectional view indicating an outline of the structure of the chemical processing device in accordance with the second embodiment of the present invention. FIG. 2(c) is a plan view of an outline of the structure of the chemical processing device in an ongoing chemical processing, and FIG. 2(d) is a cross-sectional view of an outline of the structure of the chemical processing device in an ongoing chemical processing.

Referring to FIG. 2(a) and FIG. 2(b), a chemical tank 11 stores a chemical 15, and a lid 13 is placed to float on the chemical 15. The chemical tank 11 is provided with guide rails 12 extending in a depth direction, and the lid 13 is provided with cut sections 18 capable of inserting the guide rails 12. Also, the lid 13 is provided with concave sections 14a and 14b, along a transfer direction of a tape substrate 17, for bringing the tape substrate 17 in and out. Further, rollers 16a-16d for guiding the tape substrate 17 are provided along the transfer direction of the tape substrate 17, wherein the rollers 16a and 16d are disposed outside the chemical tank 11, and the rollers 16b and 16c are disposed inside the chemical tank 11.

It is noted here that the lid 13 is formed to have a specific gravity smaller than the specific gravity of the chemical 15. As a material of the lid 13, for example, resin such as Teflon (registered trademark), acrylic fiber, polypropylene and the like may preferably be used. By so doing, even when the chemical 15 is composed of acid or alkali, the lid 13 can float on the chemical 15, and the lid 13 can be prevented from being eroded by the chemical 15, such that the chemical processing on the tape substrate 17 can be stably conducted.

Also, as the chemical 15, for example, a developing solution for a resist, a remover solution for a resist, an etching solution for a metal such as Cu can be listed. Furthermore, the tape substrate 17 can be used in, for example, a COF, a TCP and a TCM.

Then, when the tape substrate 17 is processed with the chemical, the tape substrate 17 is passed through the concave sections 14a and 14b, thereby dipping the tape substrate 17 in the chemical 15 through the lid 13. In a state in which the tape substrate 17 is dipped in the chemical 15, the tape substrate 17 is transferred through the rollers 16a-16d, and the tape substrate 17 is processed with the chemical.

As the chemical processing on the tape substrate 17 advances, the chemical 15 that adheres to the tape substrate 17 is brought out of the chemical tank 11, as indicated in FIG. 2(c) and FIG. 2(d), and the chemical 15 in the chemical tank 11 decreases. It is noted here that, since the lid 13 is placed and floated on the chemical 15, the lid 13 follows the liquid surface of the chemical 15, when the chemical 15 in the chemical tank 11 decreases and the liquid surface of the chemical 15 lowers. For this reason, even when the chemical 15 in the chemical tank 11 decreases, the state in which the lid 13 is always in contact with the liquid surface of the chemical 15 can be maintained, and the liquid surface of the chemical 15 is prevented from being exposed to the air.

As a result, by only placing and floating the lid 13 on the chemical 15, the liquid surface of the chemical 15 is not exposed to the air, the chemical processing on the tape substrate 17 can be advanced, deterioration of the chemical 15 due to oxidation of the chemical 15 or the like can be suppressed and thus the service life of the chemical 15 can be extended without using a complex mechanism for moving the lid 13. The chemical processing can be effectively conducted while maintaining the quality of the tape substrate 17 at a constant level or higher.

Also, as the guide rails 12 for guiding the lid 13 are provided, movements of the lid 13 in a horizontal direction can be prevented while maintaining the state in which the lid 13 floats on the chemical 15. For this reason, even when the lid 13 is placed to float on the chemical 15, the lid 13 can be prevented from being carried away by the chemical 15, and the lid 13 is prevented from colliding against the substrate 17, such that the tape substrate 17 can be protected.

Furthermore, since the lid 13 is provided with the concave sections 14a and 14b for bringing the tape substrate 17 in and out, the tape substrate 17 can be dipped in the chemical 15 in the state in which the lid 13 floats on the chemical 15, and the chemical processing on the tape substrate 17 can be effectively conducted while maintaining the quality of the chemical 15. Also, by providing the concave sections 14a and 14b in the lid 13, the lid 13 can be placed and floated on the chemical 15, or the lid 13 can be removed, while the tape substrate 17 is kept dipped in the chemical 15. For this reason, the lid 13 can be readily placed in the chemical tank 11, and the chemical tank 11 can be refilled with the chemical 15 while the tape substrate 17 is being processed with the chemical such that the chemical processing on the tape substrate 17 can be effectively conducted.

FIGS. 3(a)-3(d) show in cross sections a method for manufacturing a circuit substrate in accordance with a third embodiment of the present invention.

Figure 3:
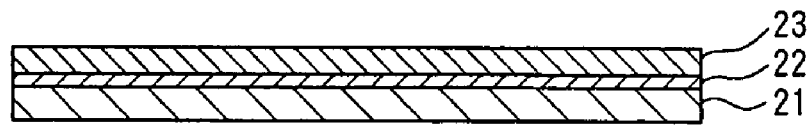
FIGS. 3(a)-3(d) show in cross sections a method for manufacturing a circuit substrate in accordance with a third embodiment of the present invention.
Figure 3:
Figure 3:
Figure 3:

In FIG. 3(a), on a tape substrate 21 is formed a conductive layer 22 such as a copper foil, and a resist layer 23 is formed on the conductive layer 22. Then, by an exposure processing on the resist layer 23, the resist layer 23 is selectively exposed.

Next, as indicated in FIG. 3(b), after the resist layer 23 is selectively exposed, a development processing is conducted on the exposed resist layer 23, to thereby form a resist pattern 24 on the conductive layer 22. It is noted here that, if a development processing on the resist layer 23 is conducted, a developing solution can be stored as the chemical 5 in FIG. 1 in the chemical tank 1. Then, the tape substrate 21 having the resist layer 23 formed thereon can be dipped in the chemical 5 while the lid 3 floats on the chemical 5.

By this, the liquid surface of the developing solution can be prevented from being exposed to the air, such that the development processing on the resist layer 23 can be conducted while suppressing the deterioration of the developing rate of the developing solution. For this reason, the resist pattern 24 can be formed with good precision while maintaining the transfer speed of the tape substrate 21 to be constant, whereby the development processing can be stably conducted while suppressing the deterioration of the production efficiency.

Next, as indicated in FIG. 3(c), after the resist pattern 24 has been formed on the conductive layer 22, an etch processing on the conductive layer 22 is conducted by using the resist pattern 24 as a mask, thereby forming a wiring layer 25 on the tape substrate 21. It is noted here that, if an etch processing on the conductive layer 22 is conducted, an etching solution, such as, iron chloride can be stored as the chemical 5 in FIG. 1 in the chemical tank 1. Then, the tape substrate 21 having the resist pattern 24 formed thereon can be dipped in the chemical 5, while the lid 3 floats on the chemical 5.

By this, the liquid surface of the etching solution can be prevented from being exposed to the air, such that the etch processing on the conductive layer 22 can be conducted while suppressing the deterioration of the etching rate of the etching solution. For this reason, the wiring layer 25 can be formed with good precision while maintaining the transfer speed of the tape substrate 21 to be constant, whereby the etch processing can be stably conducted while suppressing the deterioration of the production efficiency.

Next, as indicated in FIG. 3(d), after the wiring layer 25 has been formed on the tape substrate 21, the resist pattern 24 on the wiring layer 25 is removed. It is noted here that, for removing the resist pattern 24, the resist remover solution, such as, an organic solvent can be stored as the chemical 5 in FIG. 1 in the chemical tank 1. Then, the tape substrate 21 having the resist pattern 24 formed thereon can be dipped in the chemical 5, while the lid 3 floats on the chemical 5.

By this, the liquid surface of the resist remover solution can be prevented from being exposed to the air, such that the resist pattern 24 can be removed while suppressing the deterioration of the removing rate of the resist remover solution, and the evaporation of the resist remover solution can be suppressed. For this reason, the resist pattern 24 can be effectively removed while maintaining the transfer speed of the tape substrate 21 to be constant, whereby failures in removing of the resist pattern 24 can be prevented, and wastes of the resist remover solution can be prevented.

What is claimed is:

1. A chemical processing apparatus, comprising:
    a chemical tank that stores a chemical, the chemical tank being equipped with a guide rail;
    a transfer device that transfers an object along a first direction in a plan view into the chemical so that the object is processed in the chemical; and
    a lid that is disposed to cover a liquid surface of the chemical and to float on the chemical, the lid being equipped with a first concave section,
    the guide rail extending along a second direction intersecting with the first direction in the plan view, a part of the guide rail being disposed in the first concave section.

2. The chemical processing apparatus according to claim 1, wherein the lid is equipped with a second concave section or an opening section to take the object to be processed in and out of the chemical.

3. A chemical processing apparatus, comprising:
    a chemical tank that stores a chemical, the chemical tank being equipped with a guide rail;
    rollers that are provided in the chemical tank to transfer a tape substrate along a first direction into the chemical tank in a plan view so that the object is processed in the chemical; and
    a lid that is disposed to cover a liquid surface of the chemical and to float on the chemical, the lid being equipped with a first concave section, the lid being equipped with a part of second concave sections or opening sections along the first direction,
    the guide rail extending along a second direction intersecting the first direction in the plan view, a part of the guide rail being disposed in the first concave section.

4. The chemical processing apparatus according to claim 1, wherein the guide rail extends in a depth direction.

5. The chemical processing apparatus according to claim 1, wherein the lid is formed to have a specific gravity smaller than the specific gravity of the chemical.

6. The chemical processing apparatus according to claim 1, wherein the lid is formed from an acrylic fiber.

7. A chemical processing apparatus, comprising
    a chemical tank that stores a chemical, the chemical tank being equipped with a guide rail;
    means for transferring an object along a first direction in a plan view into the chemical; and
    a lid that is disposed to cover a liquid surface of the chemical and to float on the chemical, the lid being equipped with a first concave section inserted by the guide rail;
    the guide rail extending along a second direction intersecting with the first direction in the plan view.

* * * * *